United States Patent [19]

Yamamoto et al.

[11] Patent Number: 5,204,735
[45] Date of Patent: Apr. 20, 1993

[54] HIGH-FREQUENCY SEMICONDUCTOR DEVICE HAVING EMITTER STABILIZING RESISTOR AND METHOD OF MANUFACTURING THE SAME

[75] Inventors: Tomohiko Yamamoto; Kazuo Endou; Takashi Kimura, all of Yokohama, Japan

[73] Assignee: Kabushiki Kaisha Toshiba, Kawasaki, Japan

[21] Appl. No.: 698,341

[22] Filed: May 7, 1991

Related U.S. Application Data

[63] Continuation of Ser. No. 339,762, Apr. 18, 1989, abandoned.

[30] Foreign Application Priority Data

Apr. 21, 1988 [JP] Japan .................. 63-96904

[51] Int. Cl.$^5$ .................. H01L 23/48; H01L 29/72; H01L 21/82
[52] U.S. Cl. .................. 257/528; 257/734; 257/565
[58] Field of Search .................. 357/51, 36, 68, 65

[56] References Cited

U.S. PATENT DOCUMENTS

| | | | |
|---|---|---|---|
| 4,091,409 | 5/1978 | Wheatley, Jr. .................. | 357/65 |
| 4,134,080 | 1/1979 | Gentzler .................. | 357/51 |
| 4,266,236 | 5/1981 | Ueda .................. | 357/36 |
| 4,370,670 | 1/1983 | Nawata et al. .................. | 357/36 |
| 4,782,378 | 11/1988 | Sekiya et al. .................. | 357/36 |
| 4,835,588 | 5/1989 | Nawata et al. .................. | 357/36 |

FOREIGN PATENT DOCUMENTS

| | | | |
|---|---|---|---|
| 54-8983 | 1/1979 | Japan .................. | 357/36 |
| 55-44769 | 3/1980 | Japan . | |
| 117274 | 9/1980 | Japan . | |
| 56-37673 | 4/1981 | Japan . | |
| 210670 | 12/1982 | Japan . | |
| 60569 | 4/1983 | Japan . | |
| 68972 | 4/1983 | Japan . | |
| 68975 | 4/1983 | Japan . | |
| 122777 | 7/1983 | Japan . | |
| 58-132969 | 8/1983 | Japan . | |
| 59-119850 | 7/1984 | Japan . | |
| 62-134979 | 6/1987 | Japan . | |
| 62-269360 | 11/1987 | Japan . | |
| 62-293738 | 12/1987 | Japan . | |
| 1-270268 | 10/1989 | Japan .................. | 357/36 |

OTHER PUBLICATIONS

Japanese Patent Publication (Kokoku) No. 52-3787, Morise Bonise, publication date Jan. 29, 1977.

Primary Examiner—Eugene R. LaRoche
Assistant Examiner—Viet Q. Nguyen
Attorney, Agent, or Firm—Finnegan, Henderson, Farabow, Garrett & Dunner

[57] ABSTRACT

High-frequency transistors are formed on a semiconductor substrate. Each transistor includes an emitter having a fish-bone structure, a base formed to surround the emitter, and a base lead region connected to the base. A resistor layer having the same conductivity type as that of the base lead region, and an impurity concentration and a junction depth equal to those of the base lead region is formed in the substrate. An emitter electrode is connected to the emitter and the resistor layer. A portion of the emitter electrode connected to the resistor layer has an interdigital structure, and is connected to the resistor layer at two or more contact surface portions or an interdigital surface portion. An electrode on the wiring layer side is connected to the resistor layer. A portion of the electrode connected to the resistor layer has an interdigital structure which matches with the interdigital structure of the emitter electrode.

10 Claims, 4 Drawing Sheets

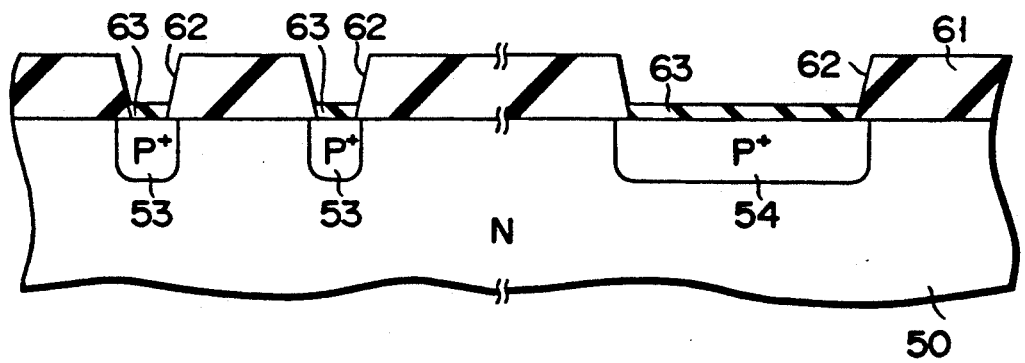
F I G. 7A
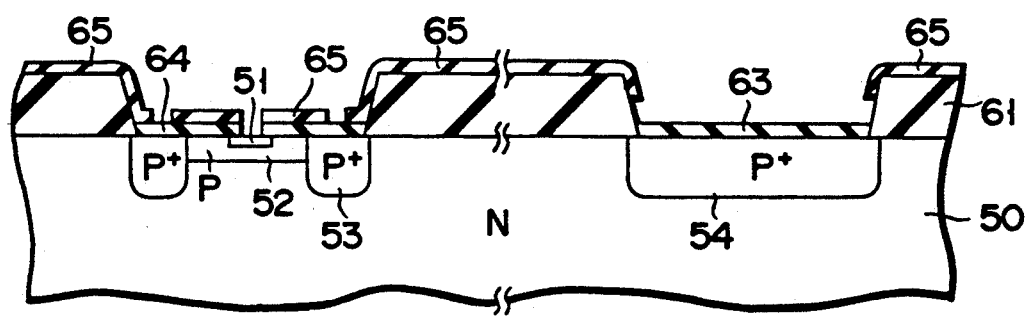
F I G. 7B
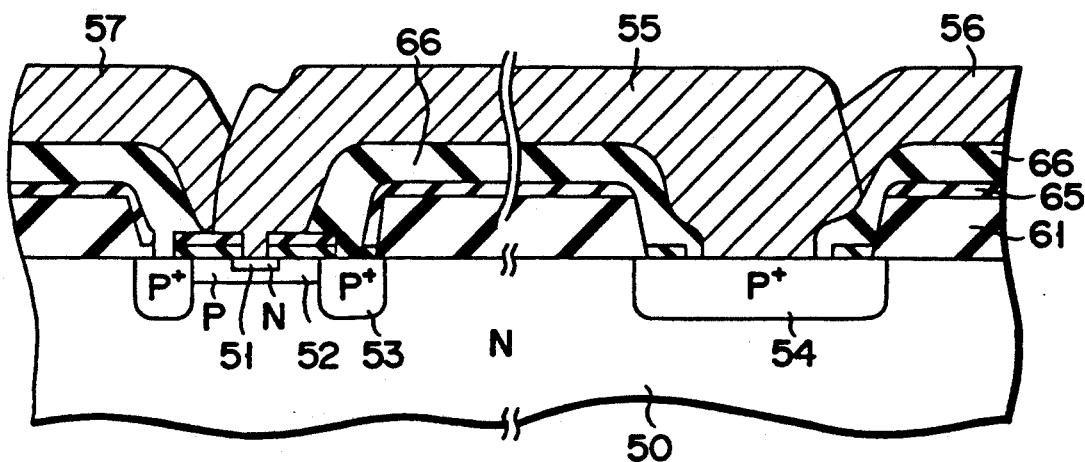
F I G. 7C

HIGH-FREQUENCY SEMICONDUCTOR DEVICE HAVING EMITTER STABILIZING RESISTOR AND METHOD OF MANUFACTURING THE SAME

This application is a continuation of application Ser. No. 07/339,762, filed Apr. 18, 1989, abandoned.

BACKGROUND OF THE INVENTION

1. Field of the Invention

The present invention relates to a semiconductor device, especially, a high-frequency output transistor and, more particularly, to an emitter stabilizing resistor connected to an emitter region of the transistor stabilizing the transistor and preventing damage to the transistor upon overloading.

2. Description of the Related Art

A so-called emitter stabilizing resistor (ESR) (or emitter series resistor) is disclosed, e.g., in Japanese Patent Publication Sho 52-3787. The ESR is formed by, e.g., an impurity layer formed in a semiconductor substrate. The ESR is used to improve the stability of a transistor a signal having a large magnitude is applied and to increase a breakdown voltage. The ESR requires the sheet resistance of greater than 1 to less than 100 $\Omega/\square$. However, when the ESR is formed by an impurity layer, in order to obtain this sheet resistance, the impurity layer must be formed by a special process. In addition, the ESR may be formed by, e.g., a metal thin film in place of a diffusion layer. However, the metal thin film is not preferable because the sheet resistance of the ESR formed by the metal thin film may generally only be reduced to 10 $\Omega/\square$ due to limitations of the material. As a method of decreasing the resistivity of the ESR, it is effective to increase the diameter of a lead hole of the resistor. However, when the diameter of the lead hole is increased, the size of the entire ESR is also increased. Therefore, parasitic capacitance is increased, and the capacitance connected to the emitter in parallel is increased. This parasitic capacitance degrades the high-frequency operation of the transistor.

As described above, in the prior art, it is difficult to reduce the resistivity of the ESR while retaining good high-frequency characteristics.

SUMMARY OF THE INVENTION

The present invention has been made in consideration of the above situations, and has as its object to provide a semiconductor device including an emitter stabilizing resistor having a lower resistance without increasing capacitance connected to the emitter.

In order to achieve the above object, a high-frequency transistor according to the present invention comprises: a semiconductor substrate (50); a fish-bone like emitter (51) formed in the semiconductor substrate (50); a base region (52) formed in the substrate (50) to surround the emitter (51); a base lead region (53) connected to the base region (52); a resistor layer (54) having the same conductivity type as that of the base lead region (53), and an impurity concentration and a junction depth substantially equal to those of the base lead region (53), formed in the substrate (50), manufactured in the single step for the base lead region (53), and serving as an emitter stabilizing resistor; emitter electrode layers (55) one end of each of which is connected to the emitter (51), and the other end of each of which is connected to the resistor layer (54) and has an interdigital structure; and a lead electrode (56) on a wiring layer side which is connected to the resistor layer (54) and has an interdigital structure to match with those of the plurality of emitter electrode layers (55).

In the above embodiment, since the emitter (55) has a fish-bone structure, the packing density of the emitter and base can be increased, thus improving the characteristics of a transistor. Note that, with the above arrangement, since the emitter (51) has a fish-bone structure, the width of the emitter electrode (55) is increased, and a current flowing one emitter electrode is increased as compared with the conventional case. However, with the above arrangement, one end of each emitter electrode (55) has an interdigital structure, and the lead electrode (56) on the wiring side has an interdigital structure to match with the interdigital structures of the emitter electrodes. Therefore, concentration of the emitter current in the resistor layer (54) can be prevented, and an apparent resistance of the resistor layer (54) is decreased. For this reason, even if the resistor layer (54) is formed in the single step of the base lead region (53), the resistance of the resistor layer (54) can be sufficiently kept low.

BRIEF DESCRIPTION OF THE DRAWINGS

FIGS. 7A to 7C are sectional views for explaining a method of manufacturing the semiconductor device shown in FIGS. 5 and 6.

DETAILED DESCRIPTION OF THE PREFERRED EMBODIMENTS

Figure 1:
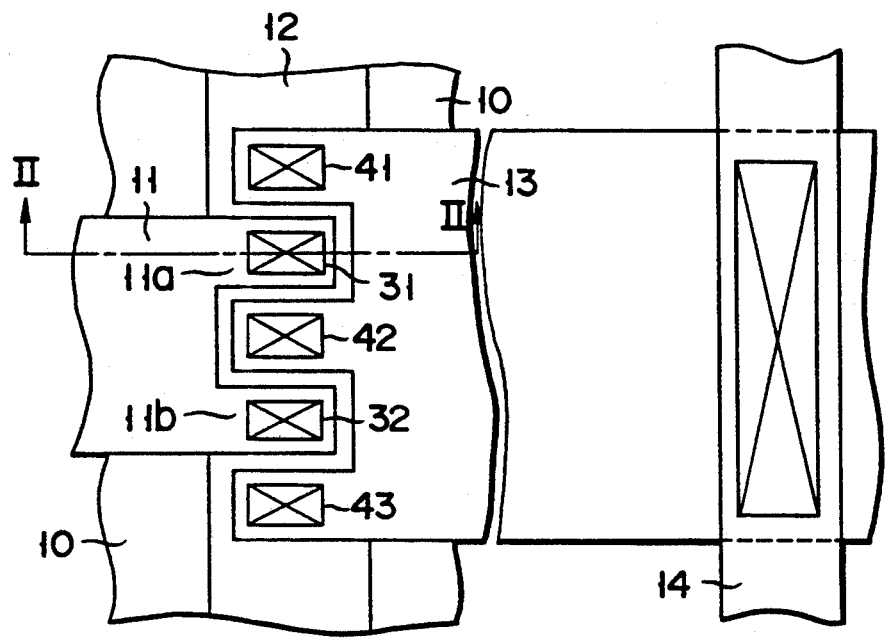
FIG. 1 is a plan view showing a structure of a semiconductor device according to a first embodiment of the present invention.
Figure 2:
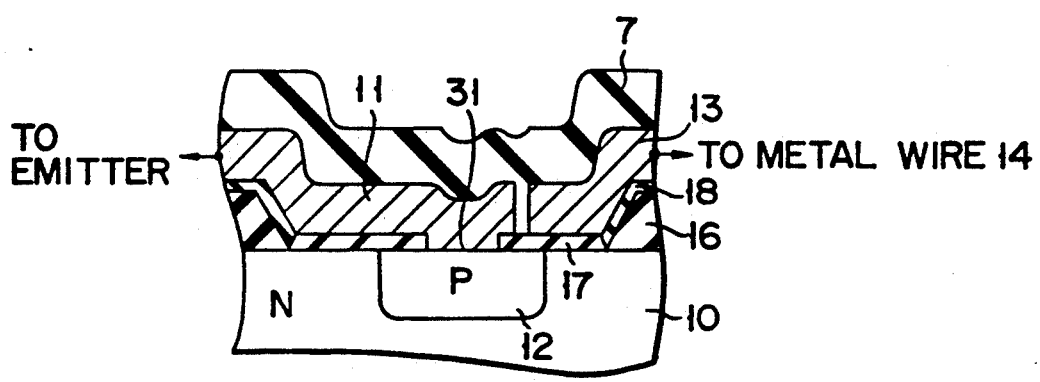
FIG. 2 is a sectional view of the semiconductor device shown in FIG. 1 sectioned by line II—II.

An emitter stabilizing resistor (ESR) according to a first embodiment of the present invention will be described hereinafter with reference to FIGS. 1 and 2. The ESR according to this embodiment has a pattern layout shown in FIG. 1, and a sectional structure shown in FIG. 2. Referring to FIGS. 1 and 2, a resistor layer 12 having a junction depth of 0.6 to 1.0 $\mu$m and a surface sheet resistance of about 10 to 60 $\Omega/\square$ is formed in an n-type semiconductor substrate 10 having an impurity concentration of about $10^{14} \sim 10^{16}$ atoms/cm$^3$. A thick SiO$_2$ film 16 having a thickness of about 1,000 nm is formed on the semiconductor substrate 10. The SiO$_2$ film 16 has a large opening on the resistor layer 12. An SiO$_2$ thin film 17 having a thickness of, e.g., about 100 nm is formed on an exposed portion of the substrate. An SiO$_2$ thin film 18 having a thickness of, e.g., about 100 nm is formed on the SiO$_2$ film 16. Emitter electrode lead holes (contact holes) 31 and 32 and wiring-side lead electrode contact holes 41, 42, and 43 are alternately formed on the SiO$_2$ film 17 on the resistor layer 12, as shown in FIG. 1. An emitter electrode 11 is formed. One end of the electrode 11 is connected to an emitter of a transistor (not shown), and the other end of the electrode 11 is separated into two portions 11$a$ and 11$b$ to form an interdigital (or comb-like) emitter electrode 11. The electrode 11 is connected to the resistor layer 12 through the contact holes 31 and 32. Similarly, an interdigital lead electrode 13 on the metal wiring side, one end of which is connected to a metal wiring layer 14, and the other end of which is separated into two portions which are alternately arranged with the portions 11a and 11b of the emitter electrode 11 to be connected to the diffusion layer 12 through the contact holes 41, 42, and 43, is formed on the films 17 and 18. A protective insulating film 7 is formed on the emitter electrode 11 and the lead electrode 13 on the metal wiring side.

With the above arrangement, in the ESR of the first embodiment, an emitter current which flows from the emitter electrode 11 to the wiring lead electrode 13 branches into two current components at the portions 11a and 11b of the emitter electrode 11, and the two current components flow into the resistor layer 12 through two contact surface portions. Then, the emitter current component supplied from the portion 11a to the resistor layer 12 flows toward the contact holes 41 and 42, and the emitter current component supplied from the portion 11b to the resistor layer 12 flows toward the contact holes 42 and 43. More specifically, the emitter current branches into two routes in the emitter electrode, and the current components are supplied to the resistor layer along these two routes. Then, the current components branched into four current components in the resistor layer, and these current components flow into the lead electrode 13 on the metal wiring side along these four routes. Therefore, the average current density of the current flowing through the resistor layer 12 is smaller than that in the conventional case, and a high concentration of emitter current in the resistor layer 12 can be prevented. For this reason, the voltage drop in the ESR of this embodiment is lower than that in the conventional ESR. Therefore, even if the resistivity of the resistor layer 12 is equal to that of the conventional resistor layer, the apparent resistance of the ESR is smaller than that of the conventional ESR.

Figure 3:
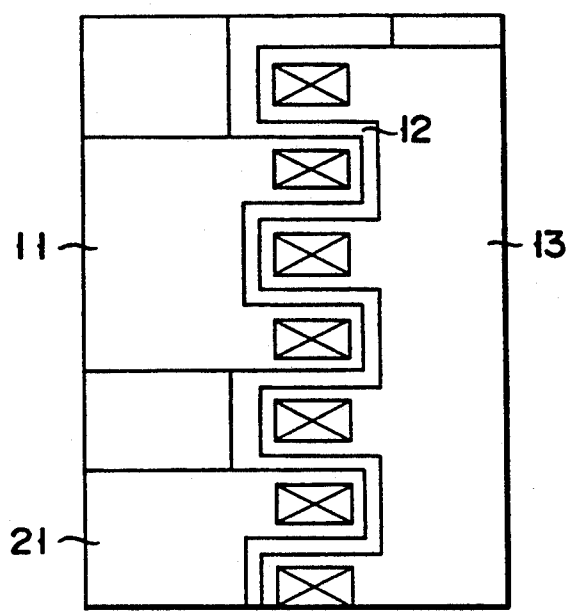
FIG. 3 is a plan view showing an application of the semiconductor device shown in FIGS. 1 and 2.

With the above arrangement, as shown in FIG. 3, when another emitter electrode 21 is formed adjacent to the emitter electrode 11, no interference occurs between the emitter currents. Therefore, the surface efficiency of the resister layer is improved. As shown in FIG. 3, the adjacent emitter electrode 21 also has an interdigital structure, and the wiring side electrode 13 has an interdigital portion corresponding to the interdigital structure of the emitter electrode 21.

A method of manufacturing the semiconductor device having the structure shown in FIGS. 1 and 2 will be described below.

The SiO$_2$ film 16 having a thickness of about 1,000 nm is formed on the n-type semiconductor substrate 10 by thermal oxidation. A wide diffusion window is formed on the SiO$_2$ film 16 by photoetching. In this state, thermal oxidation is performed again to form the SiO$_2$ film 17 having a thickness of about 100 nm on a surface of the semiconductor 10. A resist serving as a mask for ion implantation is formed. P-type impurity ions are implanted in a prospective resistor layer formation region of the substrate 10 through the SiO$_2$ film 17 using the resist as a mask. The resultant structure is subjected to a thermal treatment, and the junction depth and resistance of the resistor layer 12 is adjusted. In general, the junction depth falls within the range of 0.6 to 1.0 μm, and the surface sheet resistance falls within the range of about 10 to 60 Ω/□. Although not shown, a base lead region of the transistor is formed simultaneously with the resistor layer 12. Then, a base region is formed. Thereafter, the SiO$_2$- or SiN-base insulating film 18 is deposited on the SiO$_2$ film 16. An emitter layer (not shown) is formed. Two contact holes 31 and 32 for the emitter electrode and three contact holes 41, 42, and 43 for the metal wiring side lead electrode are formed on the insulating film 17 on the resistor layer 12. An aluminum layer is formed on the resultant structure. The aluminum layer is patterned to form the emitter electrode 11 and the lead electrode 13 on the metal wiring side. As described above, the emitter electrode 11 has an interdigital structure wherein one end is separated into two portions. The two portions are connected to the resistor layer 12 through the contact holes 31 and 32, and the other end is connected to the emitter. The lead electrode 13 on the metal wiring side has an interdigital structure wherein one end is separated into three portions in correspondence with the interdigital structure of the emitter electrode, and connected to the resistor layer 12 through the contact holes 41, 42, and 43. A protective insulating film 17 is formed. A contact hole is formed in the protective film 17. A metal film is formed on the protective film 17 to fill the contact hole. The metal film is etched to form a metal wiring layer 14 connected to the lead electrode 13 on the metal wiring side.

Figure 4:
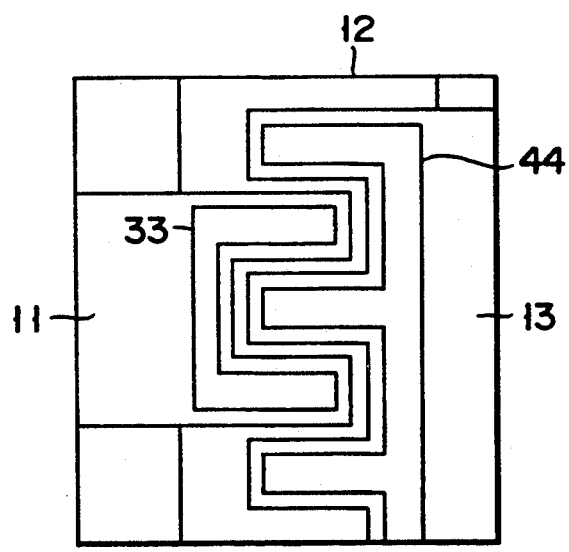
FIG. 4 is a plan view of a semiconductor device according to a second embodiment of the present invention.

A second embodiment of the present invention will be described below with reference to FIG. 4. In the second embodiment, a contact hole 33 for connecting an emitter electrode 11 to a resistor layer 12 and a contact hole 44 for connecting a lead electrode 13 on the metal wiring side to the resistor layer 12 have interdigital structures. Therefore, the electrodes 11 and 13 are in contact with the resistor layer 12 at their interdigital surfaces, respectively. When a pattern arrangement shown in FIG. 4 is employed, a current supplied from the emitter electrode 11 to the resistor layer 12 flows through the resister layer 12 in a wide distribution. Therefore, in the ESR shown in FIG. 4, a voltage drop across the resistor layer 12 can be decreased as compared with the ESR shown in FIGS. 1 and 2, thus further decreasing the apparent resistance.

In order to form the ESR according to the above embodiment, formation of a micropattern and high-precision alignment are required. This requirement can be achieved by using a reduction projection type exposing device or the like.

A third embodiment exemplifying an application of the present invention to a semiconductor device will be described below in detail with reference to FIGS. 5 to 7C.

Figure 5:
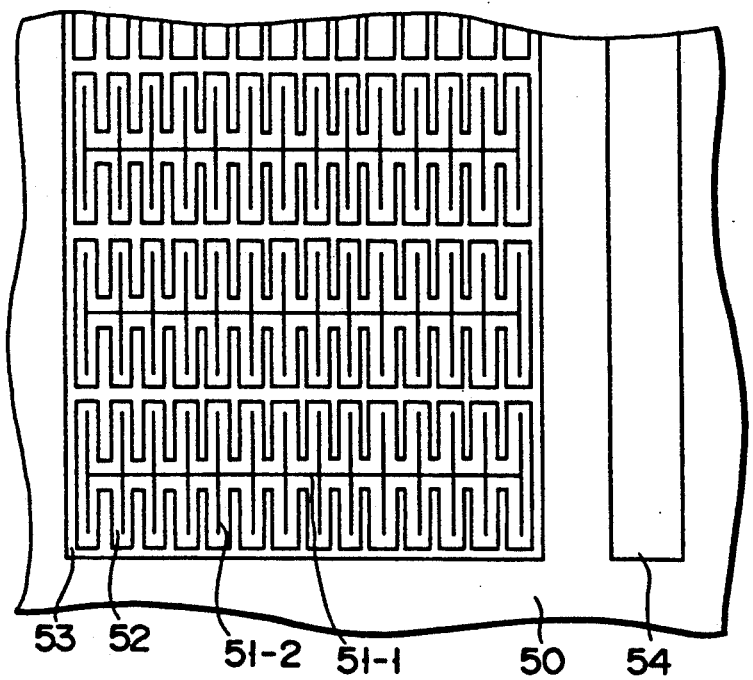
FIGS. 5 and 6 are plan views for explaining a structure of a semiconductor device according to a third embodiment of the present invention.

FIG. 5 shows a planar structure of a semiconductor substrate on which emitter, base, and resistor layers of high-frequency transistors are formed. As shown in FIG. 5, an emitter layer 51 has a so-called fish-bone structure including diffusion layers 51-1 serving as a plurality of trunks, and diffusion layers 51-2 serving as a plurality of branches, connected to the diffusion layers 51-1 serving as trunks. A base region 52 is formed to surround each emitter layer 51. A base lead high-concentration layer 53 is formed around the base region 52. A semiconductor substrate 50 serves as the collector of the high-frequency transistor. A resistor layer 54 is formed to be spaced apart from the base and emitter layers 52 and 51 (51-1 and 51-2).

Figure 6:
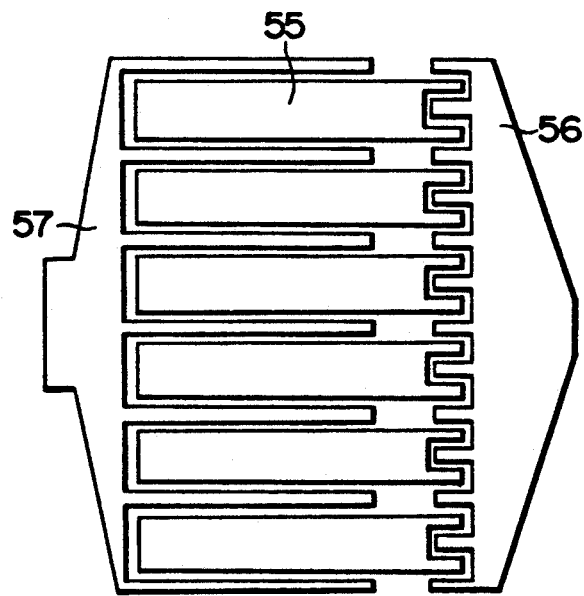

FIG. 6 shows a planar structure of electrodes connected to the emitter, base, and resistor layers 51, 52, and 54. As can be understood from FIG. 6, six emitter electrodes 55 are arranged in parallel to each other and are connected to the emitter layer 51. One end of each emitter electrode 55 is separated into two portions, and connected to the resistor layer 54 at two contact surface portions (two planes) through corresponding contact holes. On the other hand, a lead electrode 56 on the metal wiring side has an interdigital portion, and is arranged so that the interdigital portion matches the interdigital structures of the emitter electrodes 55, thus connecting the electrode 56 to the resistor layer 54. The lead electrode 56 on the metal wiring side is connected to a metal wiring layer. A base electrode 57 is connected to the base lead region 53.

By employing the arrangement shown in FIGS. 5 and 6, the emitter layer of the transistor can be micropatterned. Current supplied from distal portions (the teeth portions) of the emitter electrode 55 to the resistor layer 54 flows into the two adjacent teeth portions of the lead electrode 56 on the metal wiring side. For this reason, the apparent resistance of the resistor layer 12 is extremely low.

A method of manufacturing the semiconductor device shown in FIGS. 5 and 6 will be described hereinafter with reference to FIGS. 7A to 7C.

For example, an SiO$_2$ film 61 having a thickness of about 1,000 nm is formed on an n-type silicon substrate 50 having an impurity concentration of about $10^{15}$ atoms/cm$^3$. Impurity diffusion openings 62 are formed in the SiO$_2$ film 61 by the photoetching process. The SiO$_2$ film 63 having a thickness of about 100 nm is formed on exposed portions of the semiconductor substrate 50 by thermal oxidation. Then, p-type impurity ions are implanted in the semiconductor substrate 50 through the SiO$_2$ films 63, and annealing is performed, thereby forming the resistor layer 54 and base lead layer 53 with a high impurity concentration. Therefore, the base lead layer 53 has substantially the same conductivity type (p), the same impurity concentration (e.g., $10^{18}$ atoms/cm$^3$ to $10^{19}$ atoms/cm$^3$), and the same bonding strength (e.g., $0.6 \times 10^3$ nm to $1 \times 10^3$ nm) as those of the resistor layer 54. By the above process, the arrangement shown in FIG. 7A can be obtained.

Then, the SiO$_2$ films 61 and 63 on a prospective base layer formation region are removed. An SiO$_2$ thin layer 64 is formed on the prospective base layer region. A p-type impurity having a low concentration is ion-implanted in the prospective base layer region through the SiO$_2$ layer 64 to form a base layer 52 having a concentration of about $10^{18}$ atoms/cm$^3$ and a depth of about $0.4 \times 10^3$ nm. An SiN-based film 65 is formed on the resultant structure. The SiN-based film 65 is patterned to remain on the thick oxide film 61 and the base regions 52 and 53. The SiN-based film 65 and the SiO$_2$ film 64 on the prospective emitter region are etched to form an opening on the prospective emitter region. An n-type impurity is ion-implanted in the base layer 52 through the opening. Therefore, an n-type emitter region having an impurity concentration of about $10^{19}$ to $10^{20}$ atoms/cm$^3$, and a depth of about $2 \times 10^2$ to $3 \times 10^2$ nm is formed. At this time, since the SiO$_2$ films 61, 63, and 64, and the SiN-based film 65 serve as masks, the n-type impurity is not ion-implanted in other regions. (If required, a mask for ion implantation may be formed by a resist or the like.) By the above process, the arrangement shown in FIG. 7B can be obtained.

An opening is formed in the SiO$_2$ thin film 63 on the resistor layer 54. A thick SiO$_2$ film 66 is deposited on the resultant structure. The SiO$_2$ film 66 is etched to form contact holes for connecting the emitter electrode 55 to the resistor layer 54, and contact holes for connecting the lead electrode 56 on the metal wiring side to the resistor layer 54. A metal film (e.g., an aluminum film) for electrode formation is deposited on the resultant structure, and etched to form electrodes 55, 56, and 57 shown in FIG. 6. By the above process, the arrangement shown in FIG. 7C can be obtained.

Since the emitter layer 51 has a fish-bone structure in the above embodiments, the packing density of the emitter and base can be increased, thereby improving the characteristics of the transistor. Since the emitter layer has a fish-bone structure in the above arrangement, the width of the emitter electrode 55 is increased, and a current flowing through one emitter electrode 55 is also increased as compared with the conventional case. However, in the above embodiments, one end of each emitter electrode 55 is separated into two portions (i.e., each emitter has an interdigital structure, and the lead electrode 56 on the metal wiring side also has an interdigital portion which matches the interdigital structure of, the corresponding emitter electrode 55). Therefore, a high concentration of an emitter current in the resistor layer 54 can be prevented, thus decreasing the apparent resistance of the resistor layer 54.

In the above embodiments, an interdigital structure of the emitter electrode (e.g., when one end is separated into two portions, or when each contact hole itself has an interdigital structure) has been described. However, the present invention should not be limited to the embodiments described. For example, one end of the emitter electrode may be separated into three or more portions. In this case, of course, the electrode on the electrode wiring side should employ an interdigital structure which matches the interdigital structure of the emitter electrode.

What is claimed is:

1. A high-frequency transistor including an emitter stabilizing resistor, comprising:
    a semiconductor substrate;
    a high-frequency transistor formed in said semiconductor substrate, said transistor having a plurality of regions adjacent one another formed in the substrate including an emitter region having a fish-bone structure, a base region having a predetermined impurity concentration surrounding said emitter region, and a base lead region having a higher impurity concentration than the impurity concentration of said base region connected to said base region;
    an emitter stabilizing resistor including a resistor layer having the same conductivity type as said base lead region and an impurity concentration and a junction depth substantially equal to said base lead region formed in an area of said substrate laterally spaced from said plurality of transistor regions;
    an emitter electrode having a first end and a plurality of spaced fingers defining a second end, the first end being connected to said emitter region and overlaying at least a portion of said plurality of transistor regions, the first end and second end being contiguous, said plurality of spaced fingers being connected in common to and overlaying said resistor layer; and
    a wiring lead electrode having a plurality of spaced fingers at one end disposed between and engaged with said spaced fingers of said emitter electrode, said spaced fingers being connected to and overlaying said resistor layer.

2. A transistor according to claim 1, further comprising an insulating layer formed on an overlaying said resistor layer, said insulating layer having a plurality of contact holes therethrough, and wherein said spaced fingers of said emitter electrode are connected to at least two contact surface portions of said resistor layer through at least two of said contact holes.

3. A transistor according to claim 1, further comprising an insulating layer formed on and overlaying said resistor layer having a plurality of contact holes underlying the plurality of spaced fingers of the emitter electrode, said emitter electrode being connected to a surface portion of said resistor layer through said contact holes.

4. A semiconductor device comprising:
a semiconductor substrate;
a transistor formed in said semiconductor substrate, said transistor including emitter and base regions formed in said substrate;
a resistor layer formed in an area of said substrate laterally spaced from said emitter region;
first electrode means, connected to said resistor layer, for splitting a current into a first branch current and a second branch current and for supplying both said first branch current and said second branch current to said resistor layer, said first electrode means having a first end including a first extending finger portion connected to said resistor layer for transmitting said first branch current and a second extending finger portion spaced from the first finger portion connected to said resistor layer for transmitting said second branch current, and having a second end contiguous with the first end, whereby the current density of the current flowing through said resistor layer is reduced; and
second electrode mans having a first end including spaced extending finger portions disposed between and engaged interdigitally with the first and second finger portions of said first electrode means, and having a second end contiguous with the first end, said finger portions of said second electrode means being connected to said resistor layer, for receiving both said first branch current and said second branch current.

5. A device according to claim 4, further comprising a metal wiring layer, and wherein said first electrode means is connected to said emitter region, and
said second electrode means is connected to said metal wiring layer.

6. A device according to claim 5, further comprising an insulating layer formed on said resistor layer having a plurality of contact holes therethrough, wherein said first and second interdigital portions of said first electrode means includes a first portion and a second portion are each connected to a plurality of contact surface portions of said resistor layer through said contact holes.

7. A device according to claim 5, further comprising an insulating layer formed on said resistor layer in an interdigital structure which defines a plurality of contact holes, and wherein said first electrode means is connected to a surface portion of said resistor layer through said contact holes.

8. A device according to claim 5, wherein said emitter region has a fish-bone structure,
said first electrode means includes a plurality of emitter electrodes connected to said emitter region,
said first electrode means includes a first plurality of spaced fingers, and
said second electrode means includes a second plurality of spaced fingers disposed between said first plurality forming an interdigital structure.

9. A semiconductor device comprising:
a semiconductor substrate;
a transistor formed in said semiconductor substrate, said transistor including emitter and base regions formed in said substrate;
a resistor layer formed in an area of said semiconductor substrate;
an emitter electrode connected to said emitter region and including a first end with an interdigital structure connected to said resistor layer and a second end contiguous with the first end; and
a wiring side electrode having an interdigital structure corresponding to the interdigital structure of said emitter electrode, said wiring side electrode connected to said resistor layer by said interdigital structure of said wiring side electrode.

10. A semiconductor device according to claim 9, wherein an emitter current flows through said interdigital structure of said emitter electrode and wiring side electrode, said emitter current being split into a first branch current and a second branch current in said resistor layer.

* * * * *